United States Patent [19]
Flaherty et al.

[11] Patent Number: 5,128,944
[45] Date of Patent: Jul. 7, 1992

[54] APPARATUS AND METHOD FOR PROVIDING NOTIFICATION OF BIT-CELL FAILURE IN A REDUNDANT-BIT-CELL MEMORY

[75] Inventors: Edward H. Flaherty; Ki S. Chang, both of Houston; Mark W. Tiernan, Stafford, all of Tex.

[73] Assignee: Texas Instruments Incorporated, Dallas, Tex.

[21] Appl. No.: 639,737

[22] Filed: Jan. 11, 1991

Related U.S. Application Data

[63] Continuation of Ser. No. 357,453, May 26, 1989, abandoned.

[51] Int. Cl.⁵ .............................................. G06F 11/00
[52] U.S. Cl. ................................. 371/29.1; 365/200; 371/36; 371/68.1
[58] Field of Search .............. 371/36, 68.1, 68.2, 371/68.3, 29.1; 365/200, 201

[56] References Cited

U.S. PATENT DOCUMENTS

| | | | |
|---|---|---|---|
| 3,646,516 | 2/1972 | Flinders et al. | 371/68.1 |
| 3,833,798 | 9/1974 | Huber et al. | 371/68.3 |
| 4,426,699 | 1/1984 | Tanaka et al. | 371/68.1 |
| 4,697,233 | 9/1987 | Scheuneman et al. | 364/200 |
| 4,710,935 | 12/1987 | Kim et al. | 371/68.2 |
| 4,744,061 | 5/1988 | Takamae et al. | 365/201 |
| 4,748,594 | 5/1988 | Iida | 365/200 |
| 4,873,685 | 10/1989 | Millis, Jr. | 371/36 |

Primary Examiner—Charles E. Atkinson
Attorney, Agent, or Firm—James F. Hollander; René E. Grossman; Richard L. Donaldson

[57] ABSTRACT

An erasable, programmable ROM (10) with three redundant bit-cell arrays (10A, 10B, 10C) includes an error-flagging circuit (30) that detects bit-cell failures and provides notification of each such failure. The error-flagging circuit (30) includes a plurality of XOR gates (32), each receiving the corresponding redundant data bits for one of the bits of an addressed byte, and a NOR gate (36) which receives the outputs from each of the XOR gates (32). Each XOR gate detects when the logic states for the input redundant bits are not identical, indicating a bit-cell failure has occurred, and provides a corresponding logic state output. The NOR gate (36) detects when any of the XOR gates (32) has indicated a bit-cell failure, and generates an error-flag output providing notification of such failure.

14 Claims, 1 Drawing Sheet

APPARATUS AND METHOD FOR PROVIDING NOTIFICATION OF BIT-CELL FAILURE IN A REDUNDANT-BIT-CELL MEMORY

This application is a continuation of U.S. Ser. No. 07/357,453, filed May 26, 1989, now abandoned.

TECHNICAL FIELD OF THE INVENTION

This invention relates to computer memories, and more particularly to an electrically erasable, programmable, read-only memory (EEPROM) with redundant bit cells that uses an error-flagging circuit and method to detect bit-cell failures and provide notification of each such failure.

BACKGROUND OF THE INVENTION

An erasable, programmable, read-only memory (EPROM) provides non-volatile storage that can be erased and rewritten, albeit in a special write/erase operation that takes considerably longer than the normal read cycle. EPROMs are typically fabricated with an array of bit-cells, each with an electrically isolated, floating gate that can be selectively charged. Thus, each bit-cell can assume either of two logic states (1 or 0), depending upon whether the floating gate is charged.

Two principal mechanisms are used to provide the erasability feature of EPROMs—ultraviolet light (UV-EPROM) and low current electrical tunnelling (EEPROM). For UV-EPROMs, ultraviolet light is directed onto an entire bit-cell array, causing charge neutralization in each floating gate that is in the charged logic state. For EEPROMs, the floating gate for each bit-cell can be individually erased (discharged) using low current electrical tunneling.

For either type of EPROM, write/erase operations (logic state 1) are considerably more destructive of bit-cell integrity than is a read operation. Bit-cell degradation does not necessarily lead to bit-cell failure during the write/erase operations, so that a fatally damaged bit cell cannot necessarily be detected by an immediate read operation. Accordingly, the number of write/erase cycles before bit-cell failure is the limiting factor in determining endurance and reliability for an EPROM. Moreover, since these bit-cell failures occur randomly throughout the bit-cell array, and occur for both logic state 1 and logic state 0 bit cells, reliability considerations require a memory replacement cycle that takes into account a worst-case write/erase cycle specification to avoid data loss from bit-cell failure.

For example, in the case of EEPROMs, typical endurance specifications are on the order of ten thousand write/erase cycles for any bit-cell. While many applications for EEPROMs do not require a significant number of write/erase cycles, EEPROMs in particular are being used in an increasing variety of microcontroller-type applications (such as in the automotive and telecommunications fields) where the EEPROM program is continually updated, and the EEPROM is used to store not only program instructions but also parameters and other variable data that are also regularly modified.

The most common technique for compensating for bit-cell failures in EPROMs is to provide worst-case and/or MTBF (mean time between failure) endurance specifications. While endurance specifications provide a measure of reliability, they do not correct or compensate for bit-cell failures. Moreover, they lead to a worst-case replacement cycle for the EPROMs.

Recently, redundant-bit-bit-cell EEPROMs have become available. The Q-Cell EEPROM, available from Seeq, Inc. San Jose, CA, provides two redundant bit-cell arrays. To correct for bit-cell failure, the Q-Cell includes circuitry for comparing the redundant data bits read from corresponding redundant bit-cells according to a logical OR function—in terms of exemplary logic states, if either or both of the redundant data bits from corresponding redundant bit-cells is a logic state 1, then the Q-cell provides a logic state 1 output data bit (a logic state 0 output data bit is provided only when both redundant data bits are logic state 0). That is, in terms of the exemplary logic states, the Q-Cell technique for correcting bit-cell failures assumes that a bit-cell that fails always appears to be in the logic state 0.

The practical disadvantage of a dual-bit redundancy technique for correcting bit-cell failures is that failures can occur in bit-cells that are in either state 1 or 0, i.e., the floating gate for a bit-cell can become either inadvertently charged or discharged. While manufacturing processes can be adjusted to make inadvertent, floating gate discharge more likely than inadvertent floating gate charge, nevertheless, the inability to correct failures in logic state 0 bit cells reduces the advantages of the dual-bit redundancy technique for correcting bit-cell failures. Moreover, none of the current redundant-bit-cell memories provide any notification of a bit-cell failure that has occurred.

Another technique for correcting, or at least detecting, bit-cell failures is through the use of parity, error-checking or error-correcting bits stored along with data bytes in a memory. While parity and error checking/correcting schemes are commonly used in RAM memories, their use in EPROMs is problematic. While EPROMs are typically read on a byte basis, write/erase operations are performed on a bit basis so that only a minimum number of bit-cells are affected during each write/erase operation. Incorporating parity or error checking/correcting bits would require those bits to be changed during nearly every write/erase cycle, so that these bits would then become the limiting factor in EPROM endurance and reliability. Moreover, during a byte programming operation, individual bits are either set to 1 or set to 0, so that a byte containing parity or error checking/correcting bits would almost always require both programming operations for any byte modification.

Accordingly, a need exists for an EPROM that includes the capabilities of detecting bit-cell failures and providing an error-flag notification of such failures.

SUMMARY OF THE INVENTION

The redundant-bit-cell error-flagging circuit of the present invention increases the reliability of computer memories, such as EEPROMs, by providing an error flagging scheme for detecting bit-cell failures, and provides notification of each such failure.

In one aspect of the redundant-bit-cell error-flagging circuit, a memory including the circuit is fabricated with at least two memory cells per data bit to provide bit-cell redundancy. That is, each data bit is stored in at least two redundant bit-cells, each of which will be in an identical logic state (1 or 0) unless a bit-cell failure occurs (such as through inadvertent charging or discharging of a corresponding floating gate).

When a data bit is addressed in a read operation, each corresponding redundant bit-cell is identically addressed, and the retrieved redundant data bits are applied to an error flagging circuit that detects a bit-cell failure when the redundant data bits are not of identical logic states (1 or 0), and that provides a corresponding error notification of such bit-cell failure.

In its more specific aspects, the error flagging circuit is used in an EEPROM memory that has three redundant memory cells for each data bit. They are arranged in three redundant memory arrays.

Erasing, writing and reading operations are performed redundantly on each memory cell array. Thus, each write/erase cycle for a bit-cell redundantly affects the corresponding bit-cells in each of the memory arrays. Each bit-cell will be in an identical state unless one of the bit-cells fails.

When a data byte of N bits (typically 8) is addressed, the address is presented to each memory array to retrieve the corresponding redundant data bytes (N sets of three redundant data bits). The three redundant data bytes are input to an error flagging circuit.

The error flagging circuit includes an error-detection logic gate for each data bit of the data byte, and a single error-notification logic gate that receives as its inputs the output from each error-detection logic gate. Each error-detection logic gate receives its corresponding three redundant data bits (ABC), and implements an error-flagging operation according to the Boolean Expression AXOR BXOR CXOR=EF where EF is an error-flag indication.

The error-detection logic gates are XOR gates, while the error-notification logic gate is a NOR gate. Each error-detection logic gate provides a logic state 0 output if the logic states of the input redundant data bits are identical; otherwise, the error-detection logic gate outputs a logic state 1. The output from each error-detection logic gate is applied to the error-notification logic gate, which outputs an error-flag output logic state 0 if any error-detection logic gate input is a logic state 1 (indicating a bit-cell failure in one of the redundant bit-cells for that data bit).

The output of the error-notification logic gate is applied to an error-notification element, such as an error-flag register bit, to provide notification of the bit-cell failure. Thus, if a bit-cell failure occurs, the error flagging circuit will detect that the corresponding redundant data bits are not in identical logic states, and provide a corresponding error notification.

The error flagging circuit is used in conjunction with the majority-voting circuit described in the related application, which also receives the retrieved redundant data bits and selects as the data output logic state the logic state of a majority of the redundant data bits. Together, these circuits provide bit-cell failure detection, correction and notification.

The technical advantages of the invention include the following. The redundant-bit-cell error-flagging technique is readily adaptable to any type of computer memory, and is particularly suited for EPROMs. The technique allows notification of bit-cell failure, and a corresponding increase in the reliability of the memory. Moreover, the memory can be used until bit-cell failures occur, without having to rely on failure-predicting specifications for the memory, or having to adopt a worst-case memory replacement policy. The technique is readily adapted to any type of memory, or any degree of bit-cell redundancy, allowing any redundant bit-cell memory to be designed to take advantage of the bit-cell failure notification.

BRIEF DESCRIPTION OF THE DRAWINGS

For a more complete understanding of the present invention and for its further advantages, reference is now made to the following Detailed Description, taken in conjunction with the accompanying Drawings, in which.

DETAILED DESCRIPTION OF THE INVENTION

The preferred embodiment of the redundant bit-cell error-flagging circuit of this invention is described in connection with an EEPROM that provides triple-bit redundancy. The invention is particularly suited for EPROM memories, either EEPROMs or UV-EPROMs, because of the problem of bit-cell degradation and failure caused by write/erase operations, but is readily adaptable to any redundant-bit-cell computer memory. For this Detailed Description, it is assumed that, for any set of redundant bit-cells, only one bit-cell failure will occur during the useful life of the memory.

Figure 1:
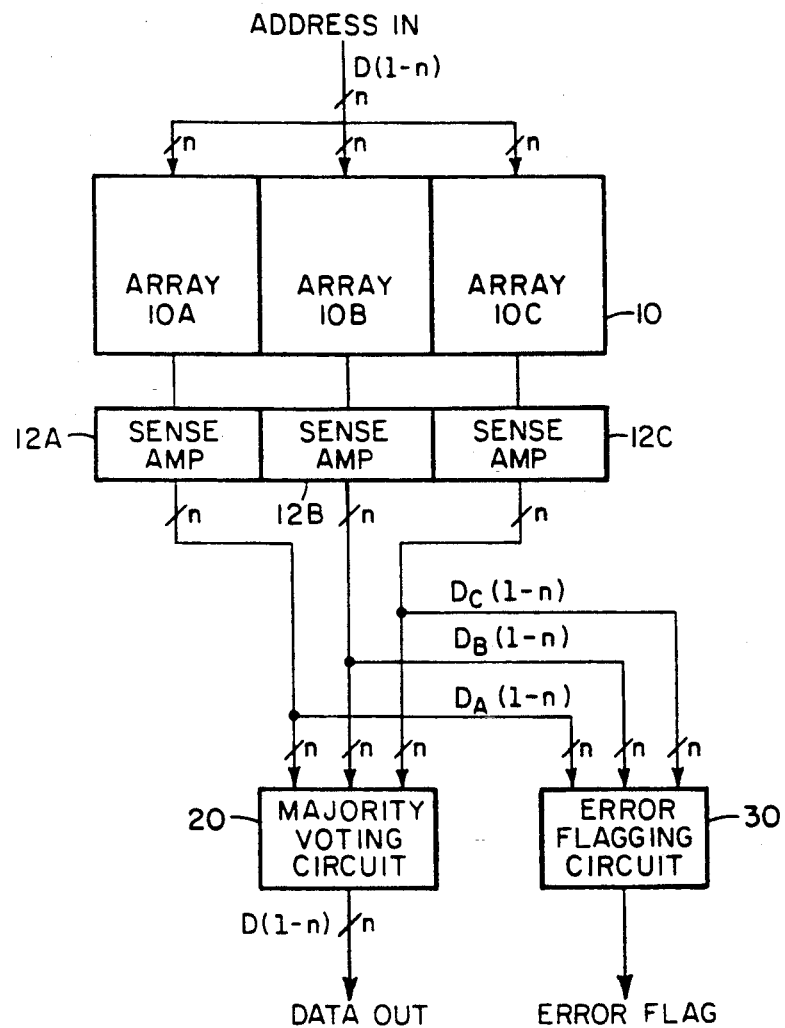
FIG. 1 shows a memory with three redundant memory arrays, an error-flagging circuit that provides bit-cell failure notification.

As shown in FIG. 1, the EEPROM includes a memory array 10 that comprises three identical, redundant bit-cell arrays 10A, 10B and 10C.

The circuitry for writing and erasing memory array 10 is not shown. Erase/write operations are provided in the conventional manner for EEPROMs, with circuitry being provided to perform redundant write/erase operations on each of the three bit-cell arrays 10A, 10B and 10C. Thus, for each data bit desired to be stored into the EEPROM, a redundant erase or write or write/erase operation is performed on each of the redundant bit-cell arrays 10A, 10B and 10C, such that the data bit is redundantly stored in the corresponding bit-cell of each array.

To read a data byte of N bits, an address for the data byte $D(1-N)$ is presented identically to each of the three redundant bit-cell arrays 10A, 10B and 10C. For each redundant array, the logic states (1 or 0) of the data bits for the addressed data byte are sensed by a corresponding sense amplifier, 12A, 12B or 12C.

The redundant data bytes $DA(1-N)$, $DB(1-N)$, and $DC(1-N)$ retrieved during the addressing operation are input to both (a) a majority voting circuit 20, and (b) an error flagging circuit 30. Majority voting circuit 20, described in detail in the related application, implements a majority voting operation that, for each set of redundant data bits, selects as the logic state of the output data bit the logic state of a majority of the data bits, thereby providing a correct output even if a bit cell failure, changes the logic state of one of the redundant data bits.

Error flagging circuit 30 provides an error-flag notification if, for any of the redundant data bits of the retrieved redundant data bytes, the corresponding logic states are not identical, indicating a bit-cell failure has occurred. That is, error flagging circuit 30 provides an error-flag notification if any bit-cell storing a data bit of the redundant addressed data bytes fails by inadvertently changing logic states.

Thus, for redundant data bytes $D_A$, $D_B$, and $D_C$, error flagging circuit 30 implements an error-flagging operation defined by the Boolean expression: $A_i$XOR $B_i$XOR $C_1XOR + A_2XOR\ B_2XOR\ C_2XOR + \ldots + A_nXOR\ B_nXOR\ C_nXOR = EF$, where $(A_nB_nC_n)$ are the logic states of corresponding redundant data bits and EF is the output error-flag notification. The Boolean operation performed by the error-flagging circuit can be implemented using any number of logic configurations that are routine in design and fabrication.

The redundant memory arrays 10A, 10B and 10C, and the corresponding sense amplifiers 12A, 12B and 12C, are conventional in design and fabrication, and need not be described in detail. The sense amplifiers are used to detect whether the addressed bit-cell is in the logic state 1 or 0. Depending upon the bit-cell logic state, each sense amplifier outputs data bits with nominal logic state levels of 0 and +5 volts.

Figure 2:
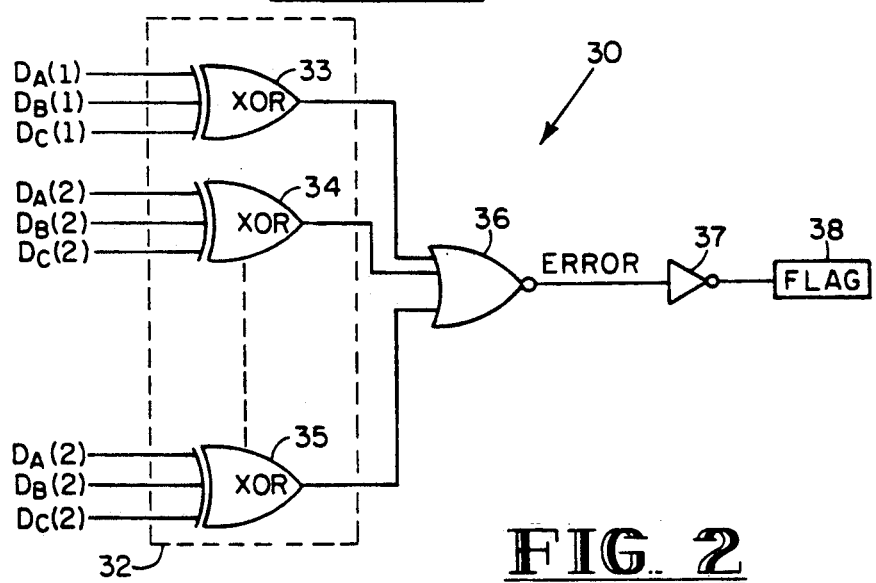
FIG. 2 shows the logic gate configuration for the error-flagging circuit.

As shown in FIG. 2, error-flagging circuit 30 is implemented using a plurality of error-detection logic gates 32 and an error-notification logic gate 36. Each error-detection logic gate 32 is an XOR (exclusive OR), while error-notification logic gate 36 is a NOR gate.

One of the error-detection logic gates 32 is provided for each data bit of the addressed data byte, and its inputs are the corresponding redundant data bits $D_A(N)$, $D_B(N)$, $D_C(N)$ Thus, an error-detection XOR gate 33 receives the redundant data bits $D_A(1)$, $D_B(1)$, $D_C(1)$, the error-detection XOR gate 34 receives the redundant data bits $D_A(2)$, $D_B(2)$, $D_C(2)$, and so on to error-detection XOR gate 35, which receives the redundant data bits $DA(N)$, $D_B(N)$, $D_C(N)$ Each error-detection XOR gate provides a logic state 0 output if the logic states for the input redundant data bits are identical; otherwise, if the logic state of one of the redundant data bits $(D_AD_BD_C)$ is different than the other two, indicating a bit-cell failure, the corresponding error-detection XOR gate outputs a logic state 1. The outputs from each of the error-detection XOR gates is provided to the error-notification NOR gate 36.

If all of the outputs from the error-detection XOR gates are logic state 0, indicating that all redundant data bits $D_A(N)$, $D_B(N)$ and $D_C(N)$ are identical (i.e., no bit-cell failure occurred), then the error-notification NOR gate 36 outputs a logic state 1; otherwise, if any of the error-detection XOR gates provides a logic state 1 output, indicating non-unanimity for the input redundant data bits $D_A(N)$, $D_B(N)$ and $D_C(N)$, then error-notification NOR gate 36 generates an error output logic state 0.

The output from error-notification NOR gate 36 is applied through an inverter 37 to a flag 38 (the same logical function could be provided by a single OR gate). For example, flag 38 can be a flag bit in a sense register. Of course, the flag indicator function of flag 38 can be performed in any number of alternative implementations (such as a flag latch or error trapping logic). Thus, if any of the error-detection XOR gates provides a logic state 1 output indicating a bit-cell failure, then error-notification NOR gate 36 provides an error logic state (through inverter 37) that causes the register flag 38 to be set, indicating an error condition. Otherwise, if none of the error-detection XOR gates detects a bit-cell failure in the redundant data bytes retrieved during an addressing operation, then error-notification NOR gate 36 causes flag 38 to be in the clear logic state, indicating that all bit-cells involved in the addressing operation are functioning normally.

While the recommended implementation of the error-flagging circuit 30 uses logic gates (error-detection XOR gates and an error-notification NOR gate), the error detection and notification operation of the present invention could be accomplished with a dynamic implementation. The dynamic implementation generally uses substantially fewer transistor elements than does the logic gate implementation, although it imposes certain timing constraints in terms of the clock edges involved in precharging and discharging. Moreover, the error notification function could be expanded to provide notification of which data bit experienced a bit-cell failure in the redundant bit-cells for that data bit.

In summary, the redundant-bit-cell error-flagging technique for providing notification of bit-cell failures may be used with any redundant-bit-cell memory, but is particularly suited to EPROMs. Each addressing operation retrieves the corresponding redundant data bytes, which are input to the error-flagging circuit. The error flagging circuit detects bit-cell failures, as indicated by redundant data bit logic states being non-identical, and provides a corresponding bit-cell-failure error-flag notification. Thus, the bit-cell-failure detection and notification technique of the present invention enables EPROM memories to achieve enhanced reliability and endurance.

The error flagging circuit has been described in connection with a preferred logic implementation. The implementation of the various functions performed by the error flagging circuit is a matter of routine design choice using any number of equivalent circuits. The use of 1 and 0 to designate specific logic states is exemplary.

Although the present invention has been described with respect to a specific, preferred embodiment, various changes and modifications may be suggested to one skilled in the art, and it is intended that the present invention encompass such changes and modifications as fall within the scope of the appended claims.

What is claimed is:

1. In a digital memory in which a data bit is stored in each of at least three corresponding redundant bit-cells (designated ABC) so that an addressing operation retrieves redundant data bytes $D_A(1-N)$, $D_B(1-N)$, and $D_C(1-N)$ of N data bits;, a redundant-bit-cell error-flagging circuit, comprising:

for each set of redundant data bits of an addressed data byte retrieved from the memory, an error-detector circuit for receiving three corresponding redundant data bits $D_A(N)$, $D_B(N)$, and $D_C(N)$ and providing a bit-cell-failure indication if said redundant data bits are not identical;

an error-notification circuits responsive to the output from each error-detector circuit for providing an error-flag indication if any error-detection circuit outputs a bit-cell failure indication;

said error-detector circuits and said error-flagging operation in accordance with a Boolean expression XOR $C_1XOR + A_2XOR\ B_2XOR\ C_2XOR + \ldots + A_nXOR\ B_nXOR\ C_nXOR = EF$, where (ABC) are the logic states for the three redundant data bits, and EF is the logic state of the output data bit the constitutes the error flag indication;

such that a notification of bit-cell failure is provided if one of the redundant bit-cells inadvertently changes logic state.

2. The device of claim 1, wherein the error flag indication from said error-detection circuit causes said error-notification circuit to set a bit-cell-failure flag bit in a sense register.

3. The device of claim 2, wherein:

said error-detection circuit is an XOR logic gate; and said error-notification circuit is a NOR logic gate.

4. The device of claim 1, wherein the error-flag indication from said error-detection circuit causes said error-notification circuit to set a bit-cell-failure flag bit in a sense register.

5. The device of claim 4, wherein said error-detection logic gate is an XOR gate, and said error-notification logic gate is a NOR gate.

6. The device of claim 5, wherein said error-flagging circuit is included in a memory that stores each data bit in corresponding redundant bit-cells.

7. The device of claim 6, wherein the memory bit-cells are arranged in three redundant arrays of bit-cells.

8. The device of claim 7, wherein the memory is an erasable, programmable, read-only memory (EPROM).

9. The device of claim 7, wherein the memory is an electrically erasable, programmable, read-only memory (EEPROM).

10. A method of providing notification of bit-cell failure in a digital memory, in which a data bit is stored in each of at least three corresponding redundant-bit-cells, comprising the steps:

retrieving from the memory redundant data bytes $D_A(1-N)$, $D_B(1-N)$ and $D_C(1-N)$ of N data bits;

for each set of redundant data bits $D_A(N)$, $D_B(N)$, and $D_C(BN)$ of a retrieved data byte, detecting the logic state of each of the redundant data bits and generating a bit-cell-failure indication if said redundant data bits are not identical; and in response to the bit-cell-failure indication, generating an error notification;

thereby implementing an error-flagging operation defined by the Boolean expression $A_1$XOR $B_1$XOR $C_1$XOR$+A_x$XOR $B_x$XOR $C_2$XOR$+\ldots+A_x$XOR $B_n$XOR $C_n$XOR$=$EF, where EF is an error notification.

11. The method of claim 10 wherein a memory is the data bits in corresponding redundant bit cells.

12. The method of claim 11 wherein the memory bit-cells are arranged in three redundant arrays of bit-cells.

13. The method of claim 11, wherein the memory is an erasable, programmable, read-only memory (EPROM).

14. The method of claim 11, wherein the memory is an electrically erasable, programmable, read-only memory (EEPROM).

* * * * *